United States Patent
Maruyama et al.

(10) Patent No.: US 10,982,053 B2
(45) Date of Patent: *Apr. 20, 2021

(54) POLYMER CONTAINING SILPHENYLENE AND POLYETHER STRUCTURES

(71) Applicant: Shin-Etsu Chemical Co., Ltd., Tokyo (JP)

(72) Inventors: Hitoshi Maruyama, Annaka (JP); Hideto Kato, Annaka (JP); Michihiro Sugo, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 39 days.

This patent is subject to a terminal disclaimer.

(21) Appl. No.: 16/414,281

(22) Filed: May 16, 2019

(65) Prior Publication Data

US 2019/0352465 A1 Nov. 21, 2019

(30) Foreign Application Priority Data

May 17, 2018 (JP) .............................. JP2018-095338

(51) Int. Cl.
| | | |
|---|---|---|
| C08G 77/52 | (2006.01) | |
| C08G 65/336 | (2006.01) | |
| G03F 7/075 | (2006.01) | |
| C08G 77/00 | (2006.01) | |
| H01L 23/29 | (2006.01) | |
| H05K 1/03 | (2006.01) | |

(52) U.S. Cl.
CPC ........... *C08G 77/52* (2013.01); *C08G 65/336* (2013.01); *G03F 7/0757* (2013.01); *C08G 77/80* (2013.01); *H01L 23/296* (2013.01); *H05K 1/0326* (2013.01); *H05K 1/0346* (2013.01); *H05K 2201/0162* (2013.01)

(58) Field of Classification Search
None
See application file for complete search history.

(56) References Cited

U.S. PATENT DOCUMENTS

| | | | | |
|---|---|---|---|---|
| 4,470,831 A * | 9/1984 | Hirose | ................... | B01D 69/12 |
| | | | | 428/391 |
| 4,990,546 A * | 2/1991 | Eckberg | ................. | C08G 77/50 |
| | | | | 522/170 |
| 5,240,971 A | 8/1993 | Eckberg et al. | | |
| 5,346,980 A * | 9/1994 | Babu | ...................... | C08G 77/52 |
| | | | | 528/32 |
| 5,750,589 A * | 5/1998 | Zech | .................... | C08G 65/336 |
| | | | | 523/109 |
| 6,072,016 A * | 6/2000 | Kobayashi | ............. | C08G 77/52 |
| | | | | 525/477 |
| 6,590,010 B2 | 7/2003 | Kato et al. | | |
| 7,785,766 B2 * | 8/2010 | Kato | ...................... | C08G 77/52 |
| | | | | 430/270.1 |
| 8,715,905 B2 | 5/2014 | Tagami et al. | | |
| 8,796,410 B2 * | 8/2014 | Sugo | ...................... | H01L 23/296 |
| | | | | 528/35 |
| 9,091,919 B2 * | 7/2015 | Urano | ....................... | G03F 7/20 |
| 10,503,067 B2 | 12/2019 | Maruyama et al. | | |
| 2009/0156753 A1 * | 6/2009 | Sugo | .................. | C08G 73/1075 |
| | | | | 525/420 |
| 2013/0108876 A1 * | 5/2013 | Komori | ................ | C08G 65/007 |
| | | | | 428/421 |
| 2013/0149645 A1 | 6/2013 | Takemura et al. | | |
| 2013/0302983 A1 * | 11/2013 | Tanabe | ..................... | B32B 7/06 |
| | | | | 438/691 |
| 2013/0323631 A1 * | 12/2013 | Asai | ...................... | G03F 7/0382 |
| | | | | 430/18 |
| 2016/0033865 A1 * | 2/2016 | Takemura | ................. | G03F 7/38 |
| | | | | 430/17 |
| 2016/0097973 A1 | 4/2016 | Urano et al. | | |
| 2017/0255097 A1 * | 9/2017 | Takemura | ............. | G03F 7/0045 |
| 2019/0049844 A1 * | 2/2019 | Maruyama | ............. | C08G 77/52 |
| 2019/0354014 A1 * | 11/2019 | Maruyama | ............. | C08G 77/46 |
| 2020/0165394 A1 * | 5/2020 | Maruyama | ............. | C08L 83/12 |
| 2020/0201182 A1 * | 6/2020 | Hirano | .................... | C08L 83/04 |

FOREIGN PATENT DOCUMENTS

| | | | |
|---|---|---|---|
| EP | 0927736 | A1 | 7/1999 |
| EP | 1186624 | B1 | 3/2003 |
| EP | 1953183 | A2 | 8/2008 |
| EP | 1953183 | A3 | 11/2008 |
| EP | 1953183 | B1 | 9/2013 |
| EP | 2397508 | B1 | 2/2016 |
| EP | 3103835 | A1 | 12/2016 |
| EP | 3 214 497 | A1 | 9/2017 |
| EP | 3 358 412 | A1 | 8/2018 |
| JP | 8-32763 | B2 | 3/1996 |
| JP | H11-80362 | A | 3/1999 |
| JP | 2002-88158 | A | 3/2002 |
| JP | 2008-184571 | A | 8/2008 |
| JP | 2012-1668 | A | 1/2012 |

OTHER PUBLICATIONS

Li et al. "Synthesis and Properties of Polymers Containing Silphenylene Moiety via Catalytic Cross-Dehydrocoupling Polymerization of 1,4-Bis(dimethylsilyl)benzene" Macromolecules, 1999, 32, 8768-8773. (Year: 1999).*
Extended European Search Report dated Sep. 20, 2019, issued in counterpart EP application No. 19172966.4. (8 pages).
Search Report dated Dec. 19, 2018, issued in counterpart EP Application No. 18187705.1 (9 pages).
Non-Final Office Action dated Sep. 18, 2020, issued in U.S. Appl. No. 16/056,711 (14 pages).

* cited by examiner

*Primary Examiner* — Robert S Loewe

(74) *Attorney, Agent, or Firm* — Westerman, Hattori, Daniels & Adrian, LLP

(57) ABSTRACT

A novel polymer containing silphenylene and polyether structures in the backbone is used to formulate a photosensitive composition having improved reliability.

5 Claims, No Drawings

POLYMER CONTAINING SILPHENYLENE AND POLYETHER STRUCTURES

CROSS-REFERENCE TO RELATED APPLICATION

This non-provisional application claims priority under 35 U.S.C. § 119(a) on Patent Application No. 2018-095338 filed in Japan on May 17, 2018, the entire contents of which are hereby incorporated by reference.

TECHNICAL FIELD

This invention relates to a polymer containing silphenylene and polyether structures.

BACKGROUND ART

In the prior art, photosensitive protective films for semiconductor devices and photosensitive dielectric films for multilayer printed circuit boards are formed of photosensitive polyimide, epoxy resin, and silicone compositions. While many photosensitive materials are known for the protection of such substrates and circuit boards, Patent Document 1 discloses a photosensitive silicone composition having improved flexibility.

Patent Document 2 discloses a photosensitive silicone composition based on a silphenylene structure-containing silicone polymer. Although this photosensitive silicone composition has improved chemical resistance to liquid photoresist strippers, the cured product can spall off from the substrate or crack during a thermal cycle test (repetitive 1,000 cycles of −25° C./10 min holding and 125° C./10 min holding). A further improvement in reliability is desired.

CITATION LIST

Patent Document 1: JP-A 2002-088158 (U.S. Pat. No. 6,590,010, EP 1186624)

Patent Document 2: JP-A 2008-184571 (U.S. Pat. No. 7,785,766, EP 1953183)

SUMMARY OF INVENTION

An object of the invention is to provide a novel polymer which may be used to formulate a photosensitive composition having improved reliability.

The inventors have found that the outstanding problem is solved by a polymer containing a silphenylene structure and a polyether structure.

According to the invention, there is provided a polymer containing a silphenylene structure and a polyether structure in the backbone.

The polymer preferably has an epoxy group and/or phenolic hydroxyl group.

Also preferably, the polymer has a weight average molecular weight of 3,000 to 500,000.

Specifically, the polymer is defined as comprising repeating units having the following formulae (1) to (4).

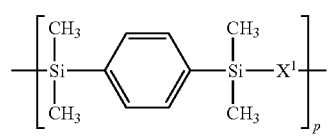

(1)

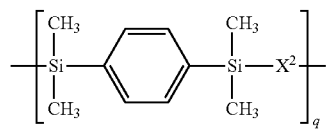

(2)

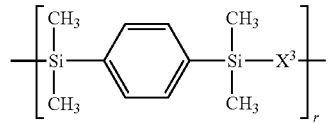

(3)

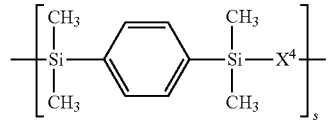

(4)

Herein $X^1$ is a divalent group having the following formula (X1), $X^2$ is a divalent group having the following formula (X2), $X^3$ is a divalent group having the following formula (X3), $X^4$ is a divalent group having the following formula (X4), and p, q, r and s are numbers in the range: $0<p<1$, $0 \leq q<1$, $0 \leq r<1$, $0 \leq s<1$, $0<q+r+s<1$, and $p+q+r+s=1$.

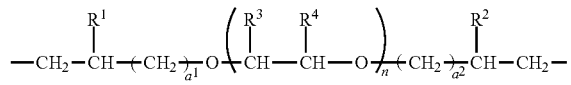

(X1)

Herein $R^1$ and $R^2$ are each independently hydrogen or a $C_1$-$C_8$ monovalent hydrocarbon group, $R^3$ and $R^4$ are each independently hydrogen or methyl, $a^1$ and $a^2$ are each independently an integer of 1 to 6, and n is an integer of 0 to 100.

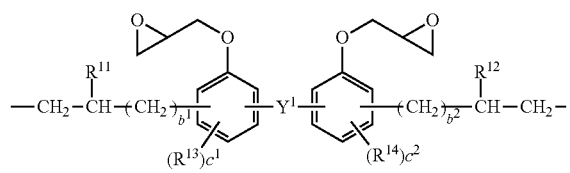

(X2)

Herein $Y^1$ is a single bond, methylene, propane-2,2-diyl, 1,1,1,3,3,3-hexafluoropropane-2,2-diyl or fluorene-9,9-diyl, $R^{11}$ and $R^{12}$ are each independently hydrogen or methyl, $R^{13}$ and $R^{14}$ are each independently a $C_1$-$C_4$ alkyl or alkoxy group, $b^1$ and $b^2$ are each independently an integer of 0 to 7, and $c^1$ and $c^2$ are each independently an integer of 0 to 2.

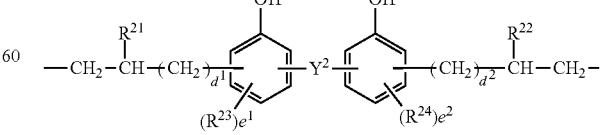

(X3)

Herein $Y^2$ is a single bond, methylene, propane-2,2-diyl, 1,1,1,3,3,3-hexafluoropropane-2,2-diyl or fluorene-9,9-diyl, $R^{21}$ and $R^{22}$ are each independently hydrogen or methyl, $R^{23}$ and $R^{24}$ are each independently a $C_1$-$C_4$ alkyl or alkoxy group, $d^1$ and $d^2$ are each independently an integer of 0 to 7, and $e^1$ and $e^2$ are each independently an integer of 0 to 2.

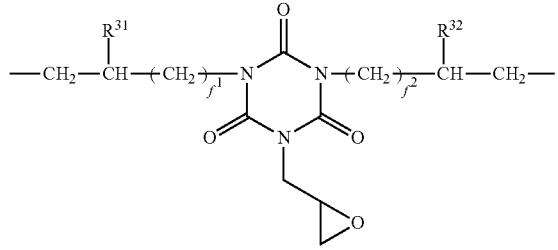
(X4)

Herein $R^{31}$ and $R^{32}$ are each independently hydrogen or methyl, and $f^1$ and $f^2$ are each independently an integer of 0 to 7.

In a preferred embodiment, $R^1$ and $R^2$ each are hydrogen and n is an integer of 5 to 20.

Advantageous Effects of Invention

The inventive polymer is readily synthesizable and used to formulate a photosensitive composition having improved reliability.

DESCRIPTION OF PREFERRED EMBODIMENTS

As used herein, the notation (Cn-Cm) means a group containing from n to m carbon atoms per group.

Polymer Containing Silphenylene and Polyether Structures

The invention provides a polymer containing a silphenylene structure and a polyether structure in the backbone. The polymer preferably has an epoxy group and/or phenolic hydroxyl group.

The polymer preferably comprises repeating units having the following formulae (1) to (4), which are sometimes designated repeating units (1) to (4), hereinafter.

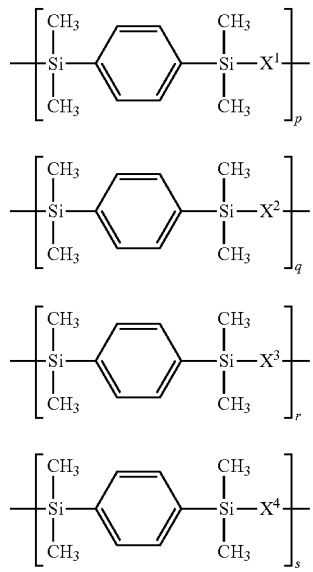

(1)
(2)
(3)
(4)

In formula (1), $X^1$ is a divalent group having the formula (X1).

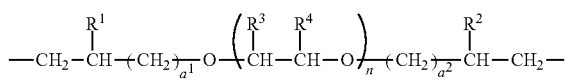
(X1)

In formula (X1), $R^1$ and $R^2$ are each independently hydrogen or a $C_1$-$C_8$ monovalent hydrocarbon group, $R^3$ and $R^4$ are each independently hydrogen or methyl, $a^1$ and $a^2$ are each independently an integer of 1 to 6, preferably 1 to 4, and more preferably 1 or 2, and n is an integer of 0 to 100, preferably 1 to 50, and more preferably 5 to 20.

The $C_1$-$C_8$ monovalent hydrocarbon groups may be straight, branched or cyclic, and include, for example, monovalent aliphatic hydrocarbon groups such as $C_1$-$C_8$ alkyl groups and $C_2$-$C_8$ alkenyl groups and monovalent aromatic hydrocarbon groups such as $C_6$-$C_8$ aryl groups and $C_7$ or $C_8$ aralkyl groups.

Examples of the $C_1$-$C_8$ alkyl group include methyl, ethyl, n-propyl, isopropyl, cyclopropyl, n-butyl, isobutyl, sec-butyl, tert-butyl, cyclobutyl, n-pentyl, cyclopentyl, n-hexyl, cyclohexyl, n-heptyl, and n-octyl. Examples of the alkenyl group include vinyl, propenyl, butenyl, and pentenyl. Examples of the aryl group include phenyl, 2-methylphenyl, 3-methylphenyl, 4-methylphenyl, 2-ethylphenyl, 3-ethylphenyl, 4-ethylphenyl, and dimethylphenyl. Examples of the aralkyl group include benzyl and phenethyl.

$R^1$ and $R^2$ are preferably hydrogen or $C_1$-$C_8$ alkyl groups, more preferably hydrogen or methyl.

In formula (X1), the alkylene oxide units with subscript n may be randomly or alternately arranged, or plural blocks of the same alkylene oxide units may be included.

In formula (2), $X^2$ is a divalent group having the formula (X2).

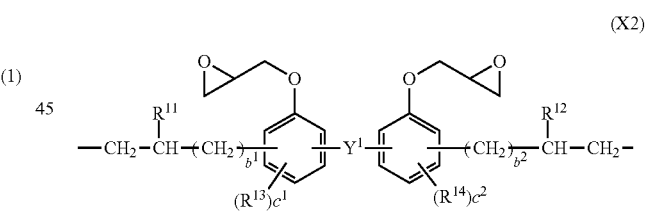
(X2)

In formula (X2), $Y^1$ is a single bond, methylene, propane-2,2-diyl, 1,1,1,3,3,3-hexafluoropropane-2,2-diyl or fluorene-9,9-diyl, $R^{11}$ and $R^{12}$ are each independently hydrogen or methyl, $R^{13}$ and $R^{14}$ are each independently a $C_1$-$C_4$ alkyl or alkoxy group, $b^1$ and $b^2$ are each independently an integer of 0 to 7, and $c^1$ and $c^2$ are each independently an integer of 0 to 2.

The $C_1$-$C_4$ alkyl group may be straight, branched or cyclic, and examples thereof include methyl, ethyl, n-propyl, isopropyl, cyclopropyl, n-butyl, isobutyl, sec-butyl, tert-butyl, and cyclobutyl. The $C_1$-$C_4$ alkoxy group may be straight, branched or cyclic, and examples thereof include methoxy, ethoxy, n-propyloxy, isopropyloxy, cyclopropyloxy, n-butyloxy, isobutyloxy, sec-butyloxy, tert-butyloxy, and cyclobutyloxy.

In formula (3), $X^3$ is a divalent group having the formula (X3).

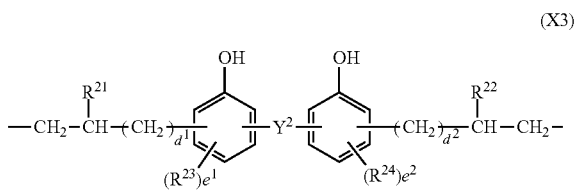
(X3)

In formula (X3), $Y^2$ is a single bond, methylene, propane-2,2-diyl, 1,1,1,3,3,3-hexafluoropropane-2,2-diyl or fluorene-9,9-diyl, $R^{21}$ and $R^{22}$ are each independently hydrogen or methyl, $R^{23}$ and $R^{24}$ are each independently a $C_1$-$C_4$ alkyl or alkoxy group, $d^1$ and $d^2$ are each independently an integer of 0 to 7, and $e^1$ and $e^2$ are each independently an integer of 0, 1 or 2. Examples of the $C_1$-$C_4$ alkyl or alkoxy group are as exemplified in the description of formula (X2).

In formula (4), $X^4$ is a divalent group having the formula (X4).

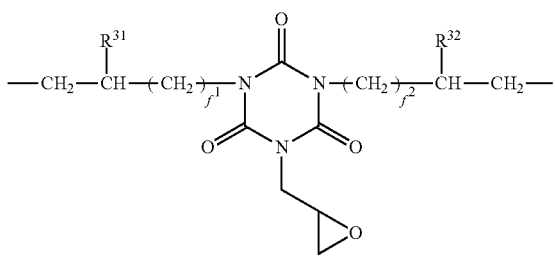
(X4)

In formula (X4), $R^{31}$ and $R^{32}$ are each independently hydrogen or methyl, and $f^1$ and $f^2$ are each independently an integer of 0 to 7.

In formulae (1) to (4), p, q, r and s indicative of contents (molar fractions) of repeating units (1), (2), (3), and (4) in the polymer, respectively, are numbers in the range: $0<p<1$, $0≤q<1$, $0≤r<1$, $0≤s<1$, $0<q+r+s<1$, and $p+q+r+s=1$. From the aspects of film formation or handling, p, q, r and s are preferably numbers in the range: $0.1≤p≤0.9$, $0≤q≤0.9$, $0≤r≤0.9$, $0≤s≤0.9$, and $0.1≤q+r+s≤0.9$, more preferably $0.2≤p≤0.8$, $0≤q≤0.8$, $0≤r≤0.8$, $0≤s≤0.8$, and $0.2≤q+r+s≤0.8$, with the proviso that $p+q+r+s=1$. The repeating units (1) to (4) may be arranged either randomly or blockwise.

The inventive polymer preferably has a weight average molecular weight (Mw) of 3,000 to 500,000, more preferably 5,000 to 200,000. Polymers with Mw in the range are fully soluble in most common organic solvents. It is noted throughout the disclosure that Mw is measured by gel permeation chromatography (GPC) versus polystyrene standards using tetrahydrofuran as the elute.

The polymer may be composed of randomly or alternately arranged repeating units (1) to (4) or plural blocks each consisting of units of the same type.

Method of Preparing Polymer Containing Silphenylene and Polyether Structures

The polymer may be prepared by addition polymerization of a compound having the formula (5), a compound having the formula (X1'), and at least one compound selected from a compound having the formula (X2'), a compound having the formula (X3'), and a compound having the formula (X4'), all shown below, in the presence of a metal catalyst.

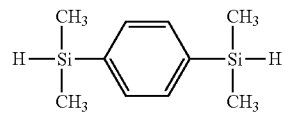
(5)

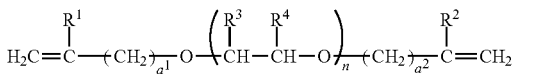
(X1')

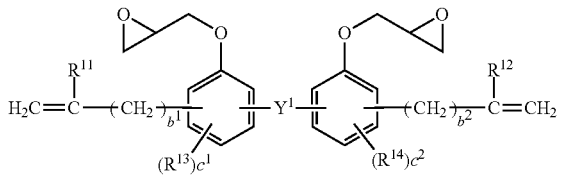
(X2')

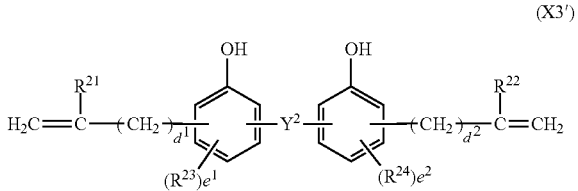
(X3')

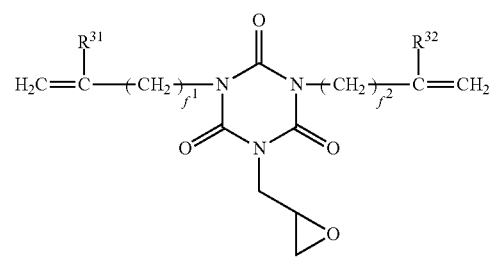
(X4')

Herein $Y^1$, $Y^2$, $R^1$ to $R^4$, $R^{11}$ to $R^{14}$, $R^{21}$ to $R^{24}$, $R^{31}$, $R^{32}$, $a^1$, $a^2$, $b^1$, $b^2$, $c^1$, $c^2$, $d^1$, $d^2$, $e^1$, $e^2$, $f^1$, $f^2$ and n are as defined above.

Examples of the metal catalyst used herein include platinum group metals alone such as platinum (including platinum black), rhodium and palladium; platinum chlorides, chloroplatinic acids and chloroplatinates such as $H_2PtCl_4 \cdot xH_2O$, $H_2PtCl_6 \cdot xH_2O$, $NaHPtCl_6 \cdot xH_2O$, $KHPtCl_6 \cdot xH_2O$, $Na_2PtCl_6 \cdot xH_2O$, $K_2PtCl_4 \cdot xH_2O$, $PtCl_4 \cdot xH_2O$, $PtCl_2$ and $Na_2HPtCl_4 \cdot xH_2O$, wherein x is preferably an integer of 0 to 6, more preferably 0 or 6; alcohol-modified chloroplatinic acids as described in U.S. Pat. No. 3,220,972; chloroplatinic acid-olefin complexes as described in U.S. Pat. Nos. 3,159,601, 3,159,662 and 3,775,452; supported catalysts comprising platinum group metals such as platinum black and palladium on supports of alumina, silica and carbon; rhodium-olefin complexes; chloro-tris(triphenylphosphine)rhodium (known as Wilkinson's catalyst); and complexes of platinum chlorides, chloroplatinic acids and chloroplatinates with vinyl-containing siloxanes, specifically vinyl-containing cyclosiloxanes.

The catalyst is used in a catalytic amount, which is preferably 0.001 to 0.1% by weight of platinum group metal based on the total weight of the reactants for polymerization reaction. In the polymerization reaction, a solvent may be used if desired. Suitable solvents are hydrocarbon solvents such as toluene and xylene. With respect to polymerization conditions, the polymerization temperature is preferably selected in a range of 40 to 150° C., more preferably 60 to 120° C., such that the catalyst may not be deactivated and the polymerization be completed within a short time. While the polymerization time varies with the type and amount of monomers, the polymerization reaction is preferably completed within about 0.5 to about 100 hours, more preferably about 0.5 to about 30 hours for preventing moisture entry into the polymerization system. After the completion of polymerization reaction, the solvent if any is distilled off, obtaining the desired polymer.

The reaction procedure is not particularly limited. The preferred procedure is by first mixing a compound having formula (X1') with one or more compounds selected from a compound having formula (X2'), a compound having formula (X3'), and a compound having formula (X4'), heating the mixture, adding a metal catalyst to the mixture, and then adding a compound having formula (5) dropwise over 0.1 to 5 hours.

The reactants are preferably combined in such amounts that a molar ratio of hydrosilyl groups on the compound having formula (5) to the total of alkenyl groups on the compounds having formulae (X1'), (X2'), (X3'), and (X4') may range from 0.67/1 to 1.67/1, more preferably from 0.83/1 to 1.25/1. The Mw of the polymer may be controlled using a molecular weight control agent such as a monoallyl compound (e.g., o-allylphenol), monohydrosilane (e.g., triethylhydrosilane) or monohydrosiloxane.

EXAMPLES

Examples of the invention are given below by way of illustration and not by way of limitation. In Examples, the weight average molecular weight (Mw) is measured by gel permeation chromatography (GPC) versus monodisperse polystyrene standards using GPC columns TSKGEL Super HZM-H (Tosoh Corp.) under analytical conditions: flow rate 0.6 mL/min, tetrahydrofuran elute, and column temperature 40° C.

The compounds used in polymer synthesis are shown below.

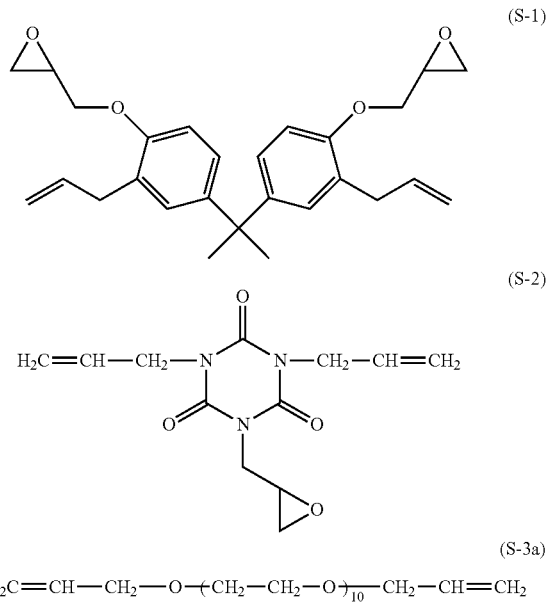

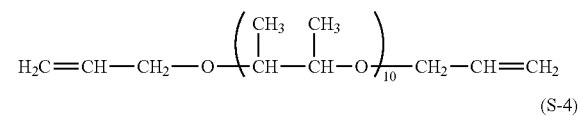

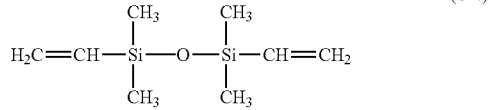

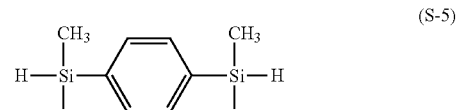

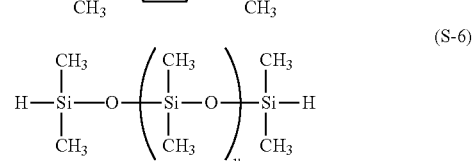

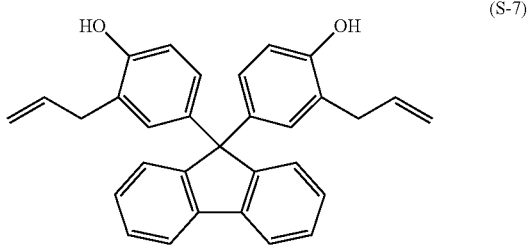

Example 1

Synthesis of Resin 1

A 3-L flask equipped with a stirrer, thermometer, nitrogen purge line and reflux condenser was charged with 156.8 g (0.40 mol) of the compound having formula (S-1), 53.9 g (0.10 mol) of the compound having formula (S-3a) (UNIOX from NOF Corp.), and 2,000 g of toluene and heated at 70° C. Thereafter, 1.0 g of a toluene solution of chloroplatinic acid (platinum concentration 0.5 wt %) was added, and 97.0 g (0.50 mol) of the compound having formula (S-5) was added dropwise over 1 hour. The ratio of the total moles of hydrosilyl groups to the total moles of alkenyl groups was 1/1. At the end of dropwise addition, the reaction solution was heated at 100° C. and aged for 6 hours. Toluene was distilled off in vacuum from the reaction solution, yielding Resin 1. Resin 1 had a Mw of 43,000. On $^1$H-NMR spectroscopy (Bruker Corp.), Resin 1 was identified to be a polymer containing repeating units (1) and (2).

Example 2

Synthesis of Resin 2

A 3-L flask equipped with a stirrer, thermometer, nitrogen purge line and reflux condenser was charged with 172.0 g (0.40 mol) of the compound having formula (S-7), 53.9 g (0.10 mol) of the compound having formula (S-3a), and 2,000 g of toluene and heated at 70° C. Thereafter, 1.0 g of a toluene solution of chloroplatinic acid (platinum concentration 0.5 wt %) was added, and 97.0 g (0.50 mol) of the compound having formula (S-5) was added dropwise over 1 hour. The ratio of the total moles of hydrosilyl groups to the total moles of alkenyl groups was 1/1. At the end of dropwise addition, the reaction solution was heated at 100° C. and aged for 6 hours. Toluene was distilled off in vacuum from the reaction solution, yielding Resin 2. Resin 2 had a Mw of 25,000. On $^1$H-NMR spectroscopy (Bruker Corp.), Resin 2 was identified to be a polymer containing repeating units (1) and (3).

Example 3

Synthesis of Resin 3

A 3-L flask equipped with a stirrer, thermometer, nitrogen purge line and reflux condenser was charged with 106.0 g (0.40 mol) of the compound having formula (S-2), 53.9 g (0.10 mol) of the compound having formula (S-3a), and 2,000 g of toluene and heated at 70° C. Thereafter, 1.0 g of a toluene solution of chloroplatinic acid (platinum concentration 0.5 wt %) was added, and 97.0 g (0.50 mol) of the compound having formula (S-5) was added dropwise over 1 hour. The ratio of the total moles of hydrosilyl groups to the total moles of alkenyl groups was 1/1. At the end of dropwise addition, the reaction solution was heated at 100° C. and aged for 6 hours. Toluene was distilled off in vacuum from the reaction solution, yielding Resin 3. Resin 3 had a Mw of 34,000. On $^1$H-NMR spectroscopy (Bruker Corp.), Resin 3 was identified to be a polymer containing repeating units (1) and (4).

Example 4

Synthesis of Resin 4

A 3-L flask equipped with a stirrer, thermometer, nitrogen purge line and reflux condenser was charged with 9.8 g (0.025 mol) of the compound having formula (S-1), 10.8 g (0.025 mol) of the compound having formula (S-7), 13.3 g (0.05 mol) of the compound having formula (S-2), 215.6 g (0.40 mol) of the compound having formula (S-3a), and 2,000 g of toluene and heated at 70° C. Thereafter, 1.0 g of a toluene solution of chloroplatinic acid (platinum concentration 0.5 wt %) was added, and 97.0 g (0.50 mol) of the compound having formula (S-5) was added dropwise over 1 hour. The ratio of the total moles of hydrosilyl groups to the total moles of alkenyl groups was 1/1. At the end of dropwise addition, the reaction solution was heated at 100° C. and aged for 6 hours. Toluene was distilled off in vacuum from the reaction solution, yielding Resin 4. Resin 4 had a Mw of 50,000. On $^1$H-NMR spectroscopy (Bruker Corp.), Resin 4 was identified to be a polymer containing repeating units (1), (2), (3), and (4).

Example 5

Synthesis of Resin 5

A 3-L flask equipped with a stirrer, thermometer, nitrogen purge line and reflux condenser was charged with 9.8 g (0.025 mol) of the compound having formula (S-1), 10.8 g (0.025 mol) of the compound having formula (S-7), 13.3 g (0.05 mol) of the compound having formula (S-2), 327.2 g (0.40 mol) of the compound having formula (S-3b), and 2,000 g of toluene and heated at 70° C. Thereafter, 1.0 g of a toluene solution of chloroplatinic acid (platinum concentration 0.5 wt %) was added, and 97.0 g (0.50 mol) of the compound having formula (S-5) was added dropwise over 1 hour. The ratio of the total moles of hydrosilyl groups to the total moles of alkenyl groups was 1/1. At the end of dropwise addition, the reaction solution was heated at 100° C. and aged for 6 hours. Toluene was distilled off in vacuum from the reaction solution, yielding Resin 5. Resin 5 had a Mw of 58,000. On $^1$H-NMR spectroscopy (Bruker Corp.), Resin 5 was identified to be a polymer containing repeating units (1), (2), (3), and (4).

Resins 1 to 5 are synthesized above, demonstrating that novel polymers containing a silphenylene structure and a polyether structure in the backbone are provided.

Japanese Patent Application No. 2018-095338 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A polymer containing a silphenylene structure and a polyether structure in the backbone and having an epoxy group and/or phenolic hydroxyl group.

2. The polymer of claim 1, having a weight average molecular weight of 3,000 to 500,000.

3. The polymer of claim 1, comprising repeating units having the following formulae (1) to (4):

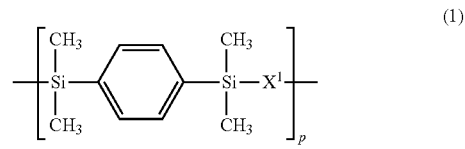

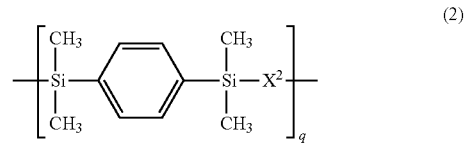

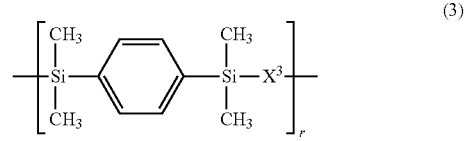

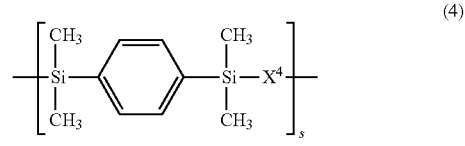

wherein $X^1$ is a divalent group having the following formula (X1), $X^2$ is a divalent group having the following formula (X2), $X^3$ is a divalent group having the following formula (X3), $X^4$ is a divalent group having the following formula (X4), and p, q, r and s are numbers in the range: $0<p<1$, $0\leq q<1$, $0\leq r<1$, $0\leq s<1$, $0<q+r+s<1$, and $p+q+r+s=1$,

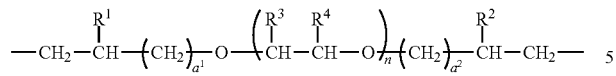
(X1)

wherein $R^1$ and $R^2$ are each independently hydrogen or a $C_1$-$C_8$ monovalent hydrocarbon group, $R^3$ and $R^4$ are each independently hydrogen or methyl, $a^1$ and $a^2$ are each independently an integer of 1 to 6, and n is an integer of 0 to 100,

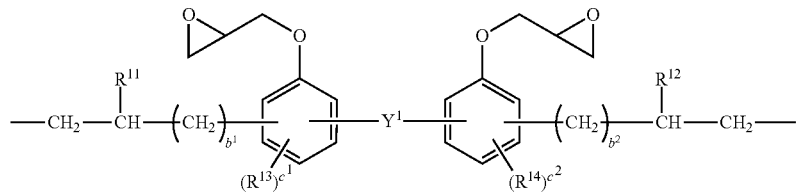
(X2)

wherein $Y^1$ is a single bond, methylene, propane-2,2-diyl, 1,1,1,3,3,3-hexafluoropropane-2,2-diyl or fluorene-9,9-diyl, $R^{11}$ and $R^{12}$ are each independently hydrogen or methyl, $R^{13}$ and $R^{14}$ are each independently a $C_1$-$C_4$ alkyl or alkoxy group, $b^1$ and $b^2$ are each independently an integer of 0 to 7, and $c^1$ and $c^2$ are each independently an integer of 0 to 2,

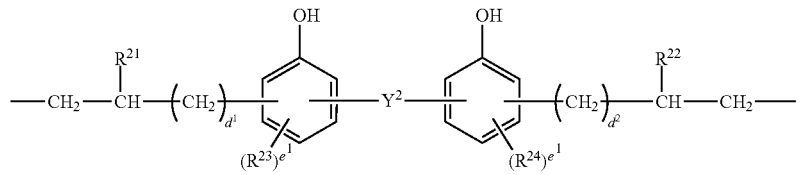
(X3)

wherein $Y^2$ is a single bond, methylene, propane-2,2-diyl, 1,1,1,3,3,3-hexafluoropropane-2,2-diyl or fluorene-9,9-diyl, $R^{21}$ and $R^{22}$ are each independently hydrogen or methyl, $R^{23}$ and $R^{24}$ are each independently a $C_1$-$C_4$ alkyl or alkoxy group, $d^1$ and $d^2$ are each independently an integer of 0 to 7, and $e^1$ and $e^2$ are each independently an integer of 0 to 2,

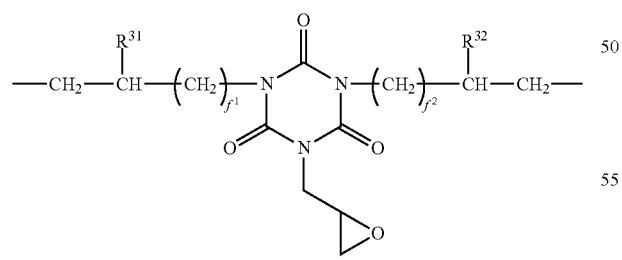
(X4)

wherein $R^{31}$ and $R^{32}$ are each independently hydrogen or methyl, and $f^1$ and $f^2$ are each independently an integer of 0 to 7.

4. The polymer of claim 3 wherein $R^1$ and $R^2$ each are hydrogen.

5. The polymer of claim 3 wherein n is an integer of 5 to 20.

* * * * *